US006697416B1

(12) United States Patent
Jennings

(10) Patent No.: US 6,697,416 B1
(45) Date of Patent: Feb. 24, 2004

(54) DIGITAL PROGRAMMABLE, SPREAD SPECTRUM CLOCK GENERATOR

(75) Inventor: Richard E. Jennings, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 559 days.

(21) Appl. No.: 09/659,993

(22) Filed: Sep. 12, 2000

Related U.S. Application Data

(60) Provisional application No. 60/162,256, filed on Oct. 29, 1999.

(51) Int. Cl.[7] .......................... H04B 15/00; H04K 1/00; H04L 27/30
(52) U.S. Cl. ...................................... 375/130; 327/291
(58) Field of Search ............................... 375/130, 367, 375/139; 327/156, 147, 164, 165, 172, 178, 184, 291

(56) References Cited

U.S. PATENT DOCUMENTS

| | | | |
|---|---|---|---|
| 5,488,627 A | | 1/1996 | Hardin et al. |
| 5,491,458 A | | 2/1996 | McCune, Jr. et al. |
| 5,631,920 A | * | 5/1997 | Hardin .................. 375/130 |
| 5,867,524 A | * | 2/1999 | Booth et al. ............ 375/130 |
| 5,872,807 A | * | 2/1999 | Booth et al. ............ 375/130 |
| 6,294,936 B1 | * | 9/2001 | Clementi ................ 327/156 |
| 6,366,174 B1 | * | 4/2002 | Berry et al. ............. 331/78 |
| 6,377,646 B1 | * | 4/2002 | Sha ......................... 375/376 |

OTHER PUBLICATIONS

Keith B. Hardin, et al., "Spread Spectrum Clock Generation for the Reduction of Radiated Emissions," IEEE, pp. 227–231, 1994.
Cornelis D. Hoekstra, "Frequency Modulation of System Clocks for EMI Reduction,", Hewlett–Packard Journal, Article 13, pp. 1–7, Aug. 1997.
Roland E. Best, "The Linear PLL" Chapter 2, Phase–Locked Loops: Design, Simulation and Applications, McGraw–Hill, 3$^{rd}$ Edition, 1997.

* cited by examiner

Primary Examiner—Jean B. Corrielus
(74) Attorney, Agent, or Firm—J. Dennis Moore; W. James Brady, III; Frederick J. Telecky, Jr.

(57) ABSTRACT

A digital spread spectrum clock generator. The generator includes a digital waveform generator adapted to generate a sequence of digital words representing a predetermined varying waveform, and an accumulator. The accumulator includes a first two input adder and a second two input adder, the second adder having its output stored and applied to a first input of the second adder. The first two input adder is adapted to receive at a first input a control word, to receive at a second input the sequence of digital words, and to provide a sum output which is provided to a second input of the second adder. One of the bits of the output of the second adder is usable as a spread spectrum clock, or it may be provided to a phase locked loop to reduce jitter.

6 Claims, 3 Drawing Sheets

DIGITAL PROGRAMMABLE, SPREAD SPECTRUM CLOCK GENERATOR

This application claims priority under 35 U.S.C. § 119 (e)(1) of provisional application No. 60/162,256 filed Oct. 29, 1999.

TECHNICAL FIELD OF THE INVENTION

This invention relates to the implementation of a digital, programmable, spread spectrum clock generator that produces a clock signal with a defined lower spectral density for reduced electromagnetic interference with very low noise and jitter.

BACKGROUND OF THE INVENTION

Today's electronic products exhibit higher and higher performance as new, particularly digital, technology is brought to bear on both consumer and business problems. As the products become faster and more complex, the amount of radiated emissions in the form of electromagnetic interference (EMI) increases. Processors of one type or another are frequently a part of electronic appliances and equipment. Whether the processor is a microprocessor ($\mu$P), a digital signal processor (DSP), or a microcontroller ($\mu$C), each requires one or more clock signals for synchronization.

The performance of equipment using these processors is increasing very rapidly, and currently, state-of-the-art equipment like high-end personal computers (PCs) use processors with 200 MHz performance and above. For this type equipment, clock rates of 60–100 MHz are required. However, clock rates of $\mu$Ps in even the 30–40 MHz range are common today in digital electronic equipment.

In the United States, the Federal Communications Commission (FCC) sets and enforces maximum satisfactory EMI levels. These regulations are becoming even stricter with new requirements expected above 1 GHz. In Germany, the Verband Deutscher Elektrotechniker (VDE) sets EMI limits. The balance of the world follows the emission standards set by the Comite International Special Des Pertabations Radio-electriques (CISPR). It is necessary for the electronic equipment manufacturer to meet these standards, in order to be able to sell into markets governed by these bodies.

In order to comply with government limits on EMI emissions, several methods have been used to minimize EMI levels. Shielding, careful routing of signal traces, slowing clock rise and fall times and filtering are common ways of reducing the EMI of electronic equipment. However, each has problems of cost, space required and the engineering time involved.

"Spread Spectrum" (SS), crystal controlled oscillators have proven to be an effective solution for providing a reliable clock with reduced emissions for current and new high performance electronic equipment. The spread spectrum technique intentionally "broadbands" a signal which is normally narrow band, spreading the energy contained within the signal over a wider bandwidth. A frequency domain representation of a narrow band input clock signal without modulation and a "spread" wide band output clock signal with modulation is shown in FIG. 1. See U.S. Pat. No. 5,491,458, entitled "APPARATUS FOR SPREADING THE SPECTRUM OF A SIGNAL AND METHOD THEREFOR," which issued on Feb. 13, 1996, for discussion of a phase modulator for spreading the spectrum of radiated emission of a clock signal.

Spread spectrum oscillators use a phase-locked-loop (PLL) technology to obtain wide deviation and crystal accuracy at frequencies as high as 135 MHz. Frequency modulation (FM) is used to spread the clock signal. For a discussion of this approach, see "Spread Spectrum Clock Generation for the Reduction of Radiated Emissions," by Hardin, Feebler & Bush, pages 227–231, 1994 *IEEE International Symposium on Electromagnetic Compatibility*, Catalog # 94CH3347-2, ISDN 0-7803-1398-4. EMI is reduced at the center frequency by "spreading" the bandwidth of the clock signal, effectively reducing the measured EMI at a given frequency. It should be noted that the total radiated energy, i.e., EMI, remains the same, but is "spread" over a wider bandwidth than the original narrow band signal.

There are several ways to achieve spectral dispersion, or spread spectrum, of a signal. Both frequency and phase modulation are used. However, where low jitter is required, frequency modulation offers the preferred solution. For electronic equipment, there are two commonly used techniques that use frequency modulation for spread spectrum oscillators to reduce EMI without degrading the clock performance: 1) divider modulation, and 2) direct modulation of the voltage controlled oscillator (VOL.). Both techniques use a PLL and produce a frequency modulated clock.

Both of these techniques use PLLs which will be described only briefly herein, since they are well known to those in the art. The PLL is a circuit which synchronizes the output signal with reference to the input signal in frequency as well as phase. A more detailed description of the PLL can be found in "The Linear PLL," by Roland E. Best, Chapter 2, Phase-Locked Loops: Design, Simulation and Applications, McGraw-Hill, 3rd Edition, 1997.

A functional block diagram of a spread spectrum clock generator (SSCG) showing the two techniques mentioned above, for comparison A functional block diagram of a spread spectrum clock generator (SSCG) showing the two techniques mentioned above, for comparison purposes, is shown in FIG. 2. Both techniques use a VOL. 13. In both techniques a clock input 10 is provided to an input of a phase detector (PD) 11. The output of the phase detector 11 is provided to a loop filter (F) 12. In the first technique the output of the loop filter 12 is provided to a VOL. 13. In the second technique, the output of the loop filter 12 is provided to a summer 14, the other input of the summer 14 being the output of a frequency modulator 15, which provides a varying voltage corresponding to the frequency modulation of the VOL. 13, with the output of the summer 14 being provided to the input to the VOL. 13. In both cases, the output of the VOL. 13 is the output of the SSCG and is provided to the input of a divider (DIV) 16, and the output of the divider 16 is provided to the other input of the phase detector 11. However, in the second technique, a frequency modulator 17 modulates the output frequency of the divider 16. The PD 11 compares the frequency and phase of the input clock waveform with the output waveform from the VOL. 13 and generates an error signal, in the form of a series of pulses indicating whether the feedback signal lags or leads the reference input signal, and having a width proportional to the phase difference between the two signals.

The F 12 then filters the unwanted harmonics from the PD error signal and integrates the voltage level of the input signal. The resulting output signal then goes to the VOL. 13 as a control voltage. The VOL. 13 control voltage is repeatedly adjusted with positive or negative signals until the output of the VOL. 13 is aligned with the input clock signal. The VOL. 13 is set to oscillate at a given frequency, depending on the output clock frequency required by the system. Where this frequency is greater than the input or reference frequency, the PLL 9 appears to multiply the frequency to the output. When this is the case, a divider is required in the feedback circuit from the VCO output to the PD in order to reduce the frequency back to that of the original input signal.

Thus, the two common prior art electronic techniques of modulating the signal to achieve a SSCG output from the PLL and the reduced emissions are 1) SSCG using PLL and Frequency Modulation and Summing of the VCO input signal, and 2) SSCG using PLL and Frequency Modulation of the Divider. A more detailed description of the first of these two techniques can be found in U.S. Pat. No. 5,488,627, entitled "SPREAD SPECTRUM CLOCK GENERATOR AND ASSOCIATED METHOD," and which issued on Jan. 30, 1996. This technique is referred to hereinafter as the Direct Modulation of the VCO (DIR. MOD.) approach.

A more detailed description of the second of these two techniques can be found in an article entitled "Frequency Modulation of System Clocks for EMI Reduction," by Cornelis D. Hoekstra, Article 13, pages 1–7, Hewlett-Packard Journal, August 1997. This technique is referred to hereinafter as the Divider Modulation (DIV. MOD.) approach.

For purposes of understanding the background of the present invention, it is useful to note that the DIR. MOD. method of producing the spread spectrum capacitively sums the modulation signal onto the input signal to the VCO. This method works well when the modulating frequency exceeds the natural loop PLL loop bandwidth by 2X. When the modulation frequency exceeds the PLL's bandwidth by a large amount, the output frequency deviation (spectrum width) and can be approximated by:

$$F(\text{deviation}) = Kv \times F_{TFER} \times V_{FMOD} \quad \text{(Equation 1)}$$

where: Kv is the sensitivity of the VCO in Hz/v, $F_{TFER}$ is the transfer function of the modulation port to the VCO input line in volt/volt, and $V_{FMOD}$ is the modulating signal in volts.

If the modulation frequency is less than ½ the loop bandwidth, the loop will adjust and remove a large part of the applied modulation. Therefore, the desired peak deviation is reduced. Also, temperature, semiconductor manufacturing process and other variables will adversely affect the output. This is a serious drawback for this type of spread spectrum approach since SSCG designs typically use modulation frequencies in the range of 30 to 200 KHz. This range is inside the loop bandwidth of many PLLs included in complex LSI integrated circuits. Typical loop bandwiths of 1 MHz and higher are common for low phase noise integrated PLLs. The DIR. MOD. technique produces symmetrical modulation and is incapable of producing the unilateral FM necessary to maintain setup and hold margins in timing critical circuits. This limitation can be overcome by forcing an offset center frequency. However, in most cases this is not an option because of system requirements and the high cost of generating a unique frequency. This also tends to increase jitter.

The Divider Modulation (DIV. MOD.) approach modulates the divider in the PLL to get the desired spread spectrum. As an example, if the divider is originally set at N=10 and the input reference frequency is 1 MHz, the output frequency will be 10 MHz, as set in the VCO. If we then change the divider to 9, the frequency output will be 11.11 MHz. So, if we then modulate the divider back and forth between N=10 and N=9, with a 100 KHz square wave, the output of the PLL will cycle between 10 and 11.11 MHz at a 100 KHz rate. The spectrum produced is centered at 10.555 MHz and has a large number of sidebands spaced with a 100 KHz offset. The flexibility of this approach to select a desired frequency output is a problem. As can be seen, the modulation is limited between two integers i.e. 9 and 10 in this case. If alternate frequencies are specified that can not be obtained with the integers, an additional PLL may be required adding undesirable expense.

Frequently, a spread spectrum clock system will require an input clock frequency that is determined by a inexpensive crystal oscillator, and a specific spread spectrum output frequency that is not compatible or easily obtained by the DIV. MOD. approach. As an example, if the required spread spectrum clock output is 66 MHz with a 1 MHz input and a peak-to-peak frequency deviation of 4 MHz, there is no integer change of the PLL divider that can accomplish these requirements.

The DIV. MOD. approach can be thought of as a square wave modulation because the PLL is asked to jump instantaneously from one frequency to another. However, actual PLLs do not respond instantaneously. The frequency modulation waveform is consequently spectrally flatter than a square wave frequency modulation.

As is known, the cycle-to-cycle jitter has ranged from 0.5% to 2% in actual designs. This is too high for some systems. Therefore, triangle wave modulation, rather than square wave modulation, has been tried, with some success, in reducing the jitter.

The goal of a SSCG clock output is to approach 0% jitter. The less jitter that the SSCG approach has the more delay the designer can tolerate before reclocking the system. Even though jitter as low as 0.5% can be achieved with the DIV. MOD. approach, significant improvement is desirable as will be shown by this invention.

SUMMARY OF THE INVENTION

The present invention provides a digital spread spectrum clock generator. The generator includes a digital waveform generator adapted to generate a sequence of digital words representing a predetermined varying waveform, and an accumulator. The accumulator includes a first two input adder and a second two input adder, the second adder having its output stored and applied to a first input of the second adder. The first two input adder is adapted to receive at a first input a control word, to receive at a second input the sequence of digital words and to provide a sum output which is provided to a second input of the second adder. One of the bits of the output of the second adder is usable as a spread spectrum clock, or it may be provided to a phase locked loop to reduce jitter.

Thus, the present invention provides a digital programmable spread spectrum clock generator (SSCG) that produces a precise output waveform with a low spectral density for reduced EMI with very low noise or jitter. Additionally, the programmability allows for real-time precise, independent settings, or changes for the output center frequency, peak deviation and modulation frequency via software without changing hardware or software. As with many digital systems, some embodiments of this invention can operate over a wide temperature range of −40° C. to +15° C.

These and other features of the invention will be apparent to those skilled in the art from the following detailed description of the invention, taken together with the accompanying drawings.

DETAILED DESCRIPTION OF THE PREFERRED EMBODIMENTS

The preferred embodiment of the present invention provides a digital spread spectrum clock generator system that reduces EMI, while increasing jitter only slightly. The system is digital and can be precisely programmed in real-time. The center frequency, peak deviation and modulation can be independently set or changed via software without changing the hardware or other components. Advantages that this system exhibits over other, even digital approaches are:

1. The ability to more accurately set the SSCG output center frequency, peak deviation and modulation frequency.

2. The ability to create a spread spectrum clock with very low jitter.

3. The ability to digitally program the center frequency, peak deviation and modulation frequency independently and in real-time.

4. The ability to operate of over a wider (up to 150° C.) temperature range because the SSCG described does not use a D/A converter and a reconstruction filter.

Figure 1:
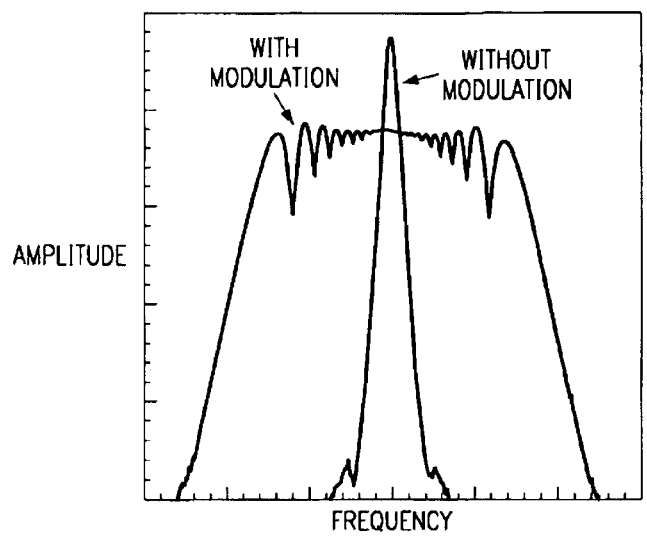
FIG. 1 is the "Frequency domain representation of a clock signal with and without the SSCG".
Figure 2:
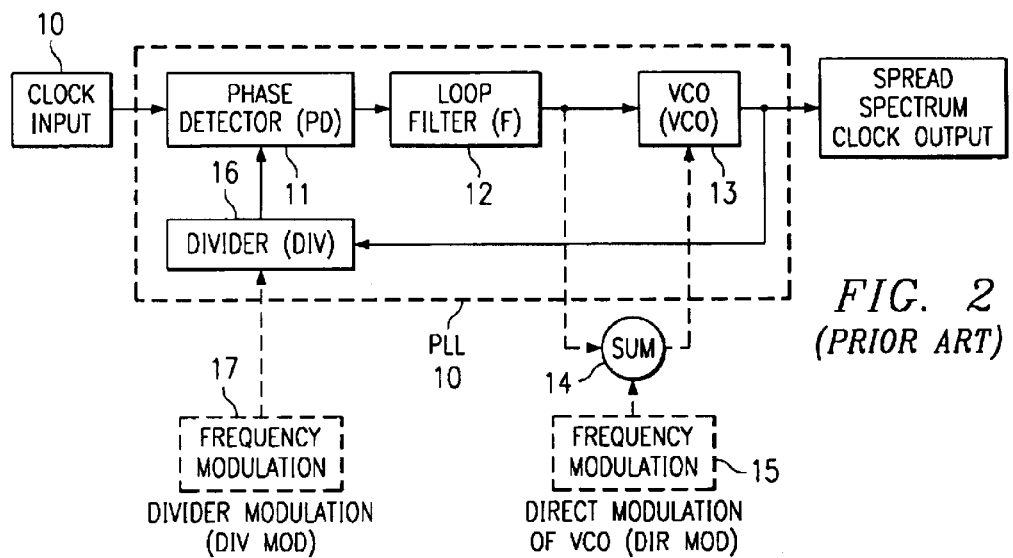
FIG. 2 is a Functional block diagram of a basic spread spectrum clock generator using a PLL and considered prior art. This block diagram shows both the "Direct" Modulation of VCO", (DIR. MOD.), method implementation as well as the "Divider Modulation", (Div. Mod.), method both considered prior art.
Figure 3:
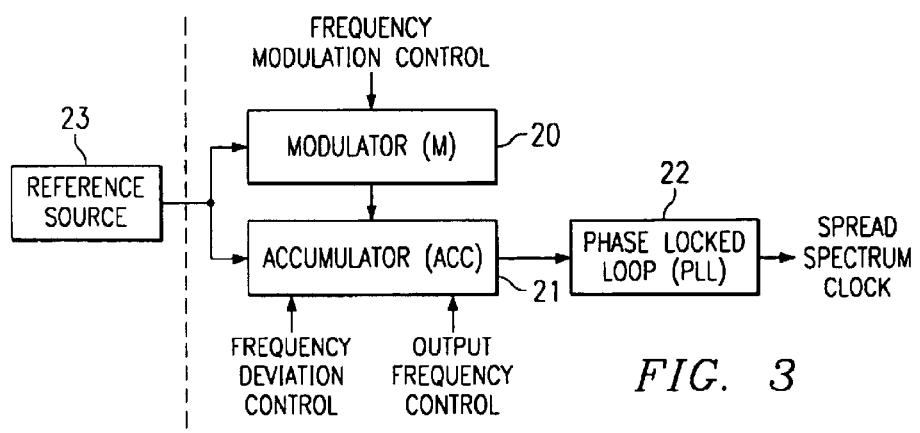
FIG. 3 is a functional block diagram of the SSCG in this invention. It is digital and programmable in real time.

A simplified block diagram of the preferred embodiment is shown in FIG. 3. The SSCG is composed of three basic functional blocks: a modulator (M) 20, an accumulator (ACC) 21 and a phase locked loop (PLL) 22. A reference source 23, referred to as the input clock $F_{CLK}$ may be generated from a external source such as a crystal oscillator, or from another PLL. This input clock $F_{CLK}$ is applied both to the modulator 20 and the accumulator 21. The modulator 20 generates from the input clock $F_{CLK}$ a sequence of digital words representing a triangle waveform, the frequency of which may be programmed by a Frequency Modulation Control word. Other waveforms may be generated in accordance with the principles of the present invention, but a triangle waveform is relatively simple to generate, and provides desirable spread spectrum performance. For example, other waveforms may be square wave, or waveforms that are symmetrically trapezoidal about a center axis, and so forth. In order to generate such other waveforms, the modulator 20 needs to be modified suitably, but such modifications are well within the scope of those of ordinary skill in this art area. In all such cases, the goal is to have a regularly varying waveform.

The modulator 20 output is then combined with the output frequency control and output frequency deviation control words. The result is applied to the accumulator 21 which produces an unfiltered spread spectrum clock, in the form of a sequence of K bit words. Finally, the most significant bit (MSB) of each of the K bit words, which includes the frequency information needed from the accumulator 21, is applied to the PLL 22 which serves to remove the jitter from the signal and provides a spread spectrum clock signal for the system with low EMI and very low jitter.

Reference Source

As mentioned above, the reference source 23, i.e., the input clock $F_{CLK}$, may be an input signal from some other function in the system, such as a crystal oscillator, other PLL, etc. It is generally much less expensive and more practical to use a signal that is already available in the system. The frequency of the reference source 23 is preferably greater than four times the center frequency of the spread spectrum output desired. This minimizes distortion due to insufficient sampling rates.

Modulator

Figure 4:
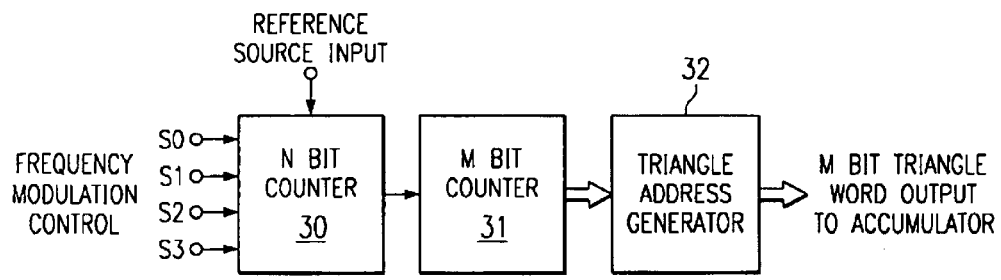
FIG. 4 is the functional block diagram of the modulator in this invention.

A functional block diagram of the modulator 20 is shown in FIG. 4. The modulator 20 is composed of three functional blocks, a programmable N-bit counter 30, a fixed M-bit counter 31 and a triangle address generator 32. The programmable counter 30 counts in response to, and therefore at the rate of, the input clock $F_{CLK}$, It also divides the frequency of the input clock $F_{CLK}$ down to a defined lower frequency, and the resulting divided clock is then applied to the fixed counter 31. The precise frequency of the programmable counter output is controlled by the four bit digital Frequency Modulation Control word applied at the frequency modulation control input. This word determines the magnitude of the count steps of the N-bit counter, and thereby the frequency of the resultant output. Typical values of the frequency divisor range form 2 to 16. However, for high frequency clock inputs larger divisors may be required to obtain the desired frequency.

The second section of the modulator 20 is a fixed counter 31 that converts the serial clock from the programmable counter 30 to a parallel digital binary word. This binary word counts from a minimum value to a maximum value at a rate proportional to the input serial clock from the programmable counter 30, divided by the number of states in the fixed counter 31. In addition, the fixed counter digital word changes in a manner such that the next state is one count greater than the previous state. This digital pattern is repeated until the maximum count is reached in the fixed counter at which time, the counter resets to a minimum value. The value of the digital binary sequence produced by the fixed counter is commonly known as a sawtooth wave pattern.

The final section, the triangle address generator 32 converts the sawtooth binary word sequence into a triangle binary word sequence. The operation is accomplished with an array of Exclusive OR gates, and occurs at either the maximum or minimum count depending on the particular circuit implementation. The output of the triangle address generator 32 is the output of the modulator 20 and is applied to the accumulator 21 in FIG. 3.

There are various ways of generating the triangle binary word sequence. The particular modulator embodiment shown in FIG. 4 has a Reference Source Input, namely, reference clock $F_{CLK}$, that is applied to the N bit programmable counter 30. The frequency modulation control pins S0, S1, S2 and S3 of the programmable counter 30 are set to a binary word having a numeric value denominated FMC. The fixed counter 31 is an M bit counter.

The resulting modulating frequency produced can be determined by the following formula:

$$F_{MOD}(Hz) = \frac{F_{CLK}(Hz)}{(2^{M+1} - 2)(2^N - FMC)} \quad \text{(Equation 2)}$$

As an example, for $F_{CLK}$=132 MHz, M=6, N=4, FMC=9; $F_{MOD}$=149,659 Hz.

Accumulator

Figure 5:
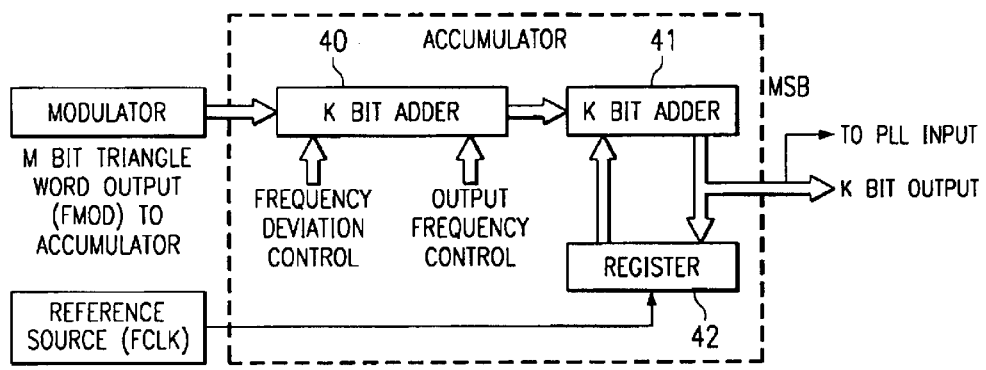
FIG. 5 is the functional block diagram of the accumulator in this invention.

A simplified functional block diagram of the accumulator 21 of FIG. 3 is shown in FIG. 5. The accumulator 21 is made up of three basic functional blocks: a first K bit adder 40, a second K bit adder 41, and one clocked register 42. The accumulator 21 is driven dynamically by the M bit triangle word output from the modulator 20 and divides down the input frequency, i.e., the frequency of $F_{CLK}$. One output of the accumulator 21 can be made of up to $2^K$ states, therefore the minimum frequency $F_{OUT}$(min.) of the output signal $F_{OUT}$ of the accumulator 21 is:

$$F_{OUT}(\text{min.}) = \frac{F_{CLK}}{2^K} \quad \text{(Equation 3)}$$

The accumulator 21 is programmed with digital words to skip a prescribed number of states on each clock edge of $F_{CLK}$. Skipping states lowers the number of states for each cycle of the accumulator output $F_{OUT}$ and therefore, the accumulator output frequency is increased. In this way the accumulator output frequency is controllably and programmably varied.

The inputs into the accumulator 21 are: the modulator output $F_{MOD}$; the reference clock, $F_{CLK}$, a Frequency Deviation Control word, and an Output Frequency Control word. The Output Frequency Control word is applied to a first input to adder 40. With no input, or a zero value applied to the other input of adder 40, the Output Frequency Control word is the output of adder 40. Thus, the Output Frequency Control word determines the lowest frequency of $F_{OUT}$ At each clock cycle, the other input to adder 40 is added to this Output Frequency Control word to produce the output of adder 40. In this manner, the desired deviation is effected in a manner that will now be described in detail.

It will be recalled that the modulator output is a sequence of M bit words defining a triangular waveform, i.e., counting regularly up from 000000 to 111111 and down from 111111 to 000000. In general, M<K. Assume, for example, that M is six. Also assume that K is sixteen. The six bit modulator output words may be applied to any six contiguous bit positions of varying bit weight of the second input to adder 40. Therefore, the amount of dispersion (deviation) of the output of adder 40, and therefore of the output clock signal $F_{OUT}$, is controllable by the placement of those six bits at the second input to adder 40. For example, placed at the position of lowest bit weight, the six modulator output bits are placed at bit positions 0 through 5, while placed at the position of highest bit weight, the six modulator output bits are placed at bit positions 10 through 15. The bits may be placed at any intermediate position, as well. As the bits are placed at higher weight bit positions, the amount of deviation increases, by a factor of two with each incremental shift in bit position at the second input of adder 40.

The Frequency Deviation Control word provides another control on the deviation of the output clock signal $F_{OUT}$ in that the Frequency Deviation Control word "fills in" the remaining bits positions of the second input to adder 40.

Thus, the six bit modulator output $F_{MOD}$ is selectively placed at the second input to adder 40 and combined there with the Frequency Deviation Control word to set the desired peak-to-peak deviation of the accumulator output. The result is the output, PGM, of the first adder 40, which is one input to the second adder 41. The output of the second adder 41 acts as the accumulator output and as the input to a register 42. The register 42 contents are provided as a second input to the second adder 41. Thus, the output of the adder 41 is fed back to the second input of adder 41.

In understanding the operation of adder 41, consider first the case where the value stored in register 42 is zero, and the output of adder 40 is a constant value of one. Because of the feedback, K bit adder 41 will count up by one every clock cycle from zero to $2^K$, then "turn over" to zero and count again as before, repeating cyclically, and thus establishing a lowest frequency output of the accumulator. Any value at the output of adder 40 greater than one causes a skipping of counts in adder 41, and thus an acceleration of the counting cycle and a corresponding increase in the output frequency of the accumulator. In this way, the deviation built into the output of adder 40, as described in detail above, is applied to the output of adder 41.

The accumulator 21 can thus be programmed with a digital word input to the Frequency Deviation Control input and with a digital word input to Output Frequency Control input of the accumulator 21. The accumulator output can be defined as:

$$F_{OUT} = \frac{F_{CLK}(PGM + 1)}{2^K} \quad \text{(Equation 4)}$$

The center frequency of $F_{OUT}$ can be controlled and changed in real-time to a high degree of accuracy. The target center frequency may be obtained within a +/− value determined by Equation 3.

The peak deviation of $F_{OUT}$ may be controlled and varied in real-time to within a factor of two. The SSCG simulation described later, incorporates sixteen bits for the center frequency, namely the Output Frequency Control input to the accumulator, and sixteen bits for the modulation control. Of the sixteen modulation bits, ten are static and six are dynamic. The six dynamic bits contain the triangle $F_{MOD}$ word and may be positioned anywhere in within the modulation binary word, the second input of adder 40. Therefore, the peak deviation may be controlled and varied in real time to within a factor of two. For example, if the peak deviation is 100 KHz, the next lower peak deviation obtainable is 50 KHz and the next available higher peak deviation is 200 KHz.

Because of the flexibility and precision setting of the preferred embodiment of the present invention, there is the capability to place the spread spectrum frequency envelope lower or higher in frequency than the unmodulated clock. This capability has the advantage of limiting the maximum frequency during modulation which prevents "setup and hold" violations in clocked systems. Prior art systems are incapable of this "down band" or "upband" modulation because the modulation is symmetrical with reference to the center frequency. Prior art systems can perform a similar modulation only if a new reference frequency, $F_{CLK}$, is used for the unmodulated case.

Other embodiments may vary equation 4, as desired to achieve modified objectives. However, this equation is representative of the general class of accumulator outputs.

Phase Lock Loop

Phase lock loop (PLL) circuits are well known to those in the art. In this embodiment the PLL is used to smooth the jitter of the accumulator 21 output signal. Since the most significant bit (MSB) of the accumulator output signal $F_{OUT}$ has all the information and frequency accuracy that is necessary, it is the only one of concern. However the MSB contains a large amount of phase modulation which occurs due to accumulation of phase error. As a result, the cycle-to-cycle (C2C) jitter in the MSB of the accumulator output is significant. A tracking PLL is therefore desirable to substantially eliminate this jitter. The peak-to-peak C2C jitter in the MSB of the accumulator output is 2X the period of the accumulator clock. Therefore, the higher the accumulator clock, the lower the C2C jitter of the MSB.

Simulation of the Preferred Embodiment

The circuit function in FIG. 3 was simulated and the results confirm the operation of this SSCG as described herein.

The functional settings for the simulation were as follows:

Frequency of input clock, ($F_{CLK}$): 132 MHz

Frequency of PLL output, ($F_{SSC}$): 33 MHz

Accumulator bit length: 16 bits

Frequency deviation: +/−1.8 MHz

Modulator frequency, ($F_{MOD}$) 147 KHz

Modulator bit length 6 bits

Figure 6:
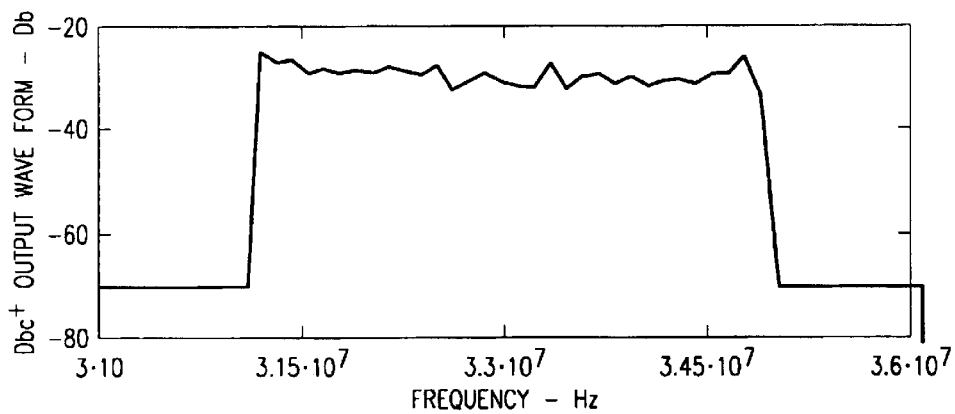
FIG. 6 is the simulated spread spectrum clock output waveform showing amplitude vs frequency. The amplitude reference is the reference source or input clock.
Figure 7:
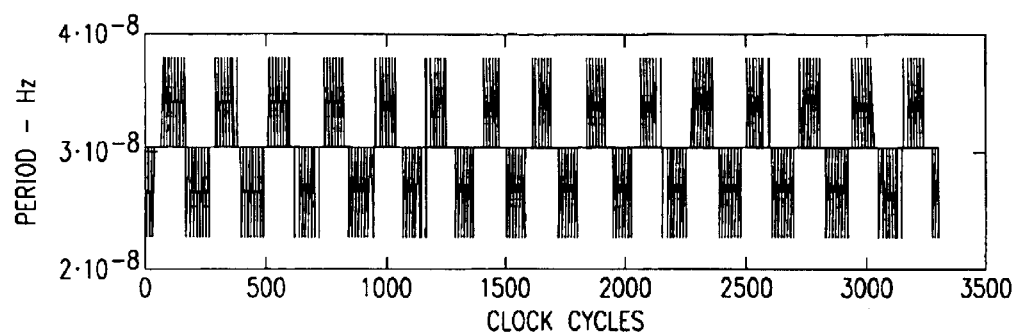
FIG. 7 is the simulated accumulator most significant bit (MSB) output showing period vs clock cycles.
Figure 8:
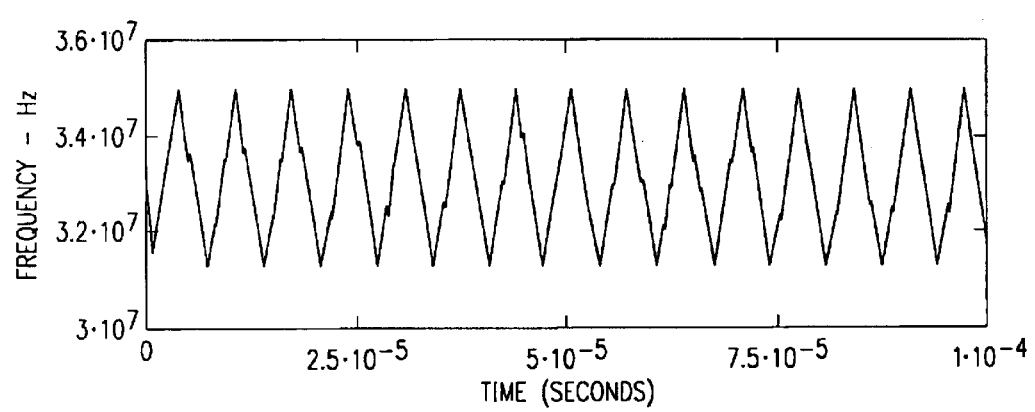
FIG. 8 shows the simulated triangular output from the PLL. This is also the output of the SSCG. The axis are frequency and time.

The results of this simulation are shown in FIGS. 6, 7 and 8.

FIG. 6 shows the histogram of the Spread Spectrum Clock (SSC) output. The x axis is the frequency of the SSC output signal, and the y axis is the suppression, in dB, of the SSC output signal with reference to the input clock signal, $F_{CLK}$. It can be seen that the unmodulated input clock signal has been suppressed by almost 30 dB and also has the desired center frequency of 33 MHz. In addition, the output spectrum has the defined 147 KHz deviation and is essentially flat, as desired.

FIG. 7 is a graph of the MSB period vs number of clock cycles for the output at the accumulator. The output period on average is correct at 33 MHz. However, there are large variations in the period as the modulator sweeps the accumulator's input at the $F_{MOD}$ rate (147 KHz). Also the large cycle-to-cycle jitter on the output at this point is not satisfactory, therefore the PLL is used to reduce the jitter.

FIG. 8 shows the simulated output for the PLL. This is a graph of SSC frequency vs Time. It can be seen that the PLL smoothes the period variations out of the accumulator MSB signal shown in FIG. 7 to produce a frequency modulated clock that varies at the $F_{MOD}$ rate and has a triangle frequency vs time trajectory.

Figure 9:
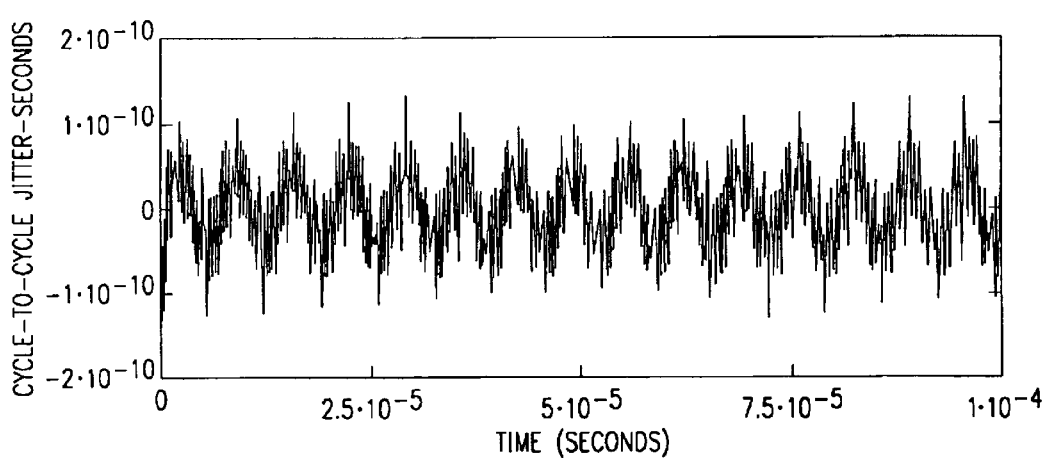
FIG. 9 shows the simulated output from the SSCG (and PLL) showing cycle-to-cycle (C2C) jitter.

In addition to lowering the power spectral density of the clock signal, the SSCG, must perform the operation without adding jitter to the output. FIG. 9 shows the simulated cycle-to-cycle (C2C) jitter of the SSCG PLL output. This shows a very low approximately +/−100 ps jitter, very acceptable for most applications and much lower than previously known SSCG systems.

Although the present invention and its advantages have been described in detail, it should be understood that various changes, substitutions and alterations can be made herein without departing from the spirit and scope of the invention as defined by the appended claims.

What is claimed is:

1. A digital spread spectrum clock generator, comprising a digital waveform generator adapted to generate a sequence of digital words representing a predetermined varying waveform;

an accumulator, comprising a first two input adder and a second two input adder, said second adder having its output stored and applied to a first input of said second adder, wherein said first two input adder is adapted to receive at a first input a control word and to receive at a second input said sequence of digital words to provide a sum output which is provided to a second input of said second adder, such that one of the bits of said output of said second adder is usable as a spread spectrum clock.

2. A digital spread spectrum clock generator as in claim 1, wherein a most significant bit of said output of said second adder is usable as a spread spectrum clock.

3. A digital spread spectrum clock generator as in claim 1, wherein said predetermined varying waveform is a triangle waveform.

4. A digital spread spectrum clock generator as in claim 1, wherein the number of bits in the words of said predetermined varying waveform is less than the number of bits of said first adder, and wherein said words of said predetermined varying waveform are provided at said first input of said first adder at any of a plurality of positions of varying bit weight.

5. A digital spread spectrum clock generator as in claim 4, further comprising means for determining the bit values of said second input of said first adder other than those to which said words of said predetermined varying waveform are applied.

6. A digital spread spectrum clock generator as in claim 1, further comprising a phase locked loop adapted to receive said one of said bits of said output of said second adder.

* * * * *